United States Patent
Chu et al.

(10) Patent No.: US 9,000,766 B2
(45) Date of Patent: Apr. 7, 2015

(54) RADIO FREQUENCY (RF) COIL ARRAY FOR A MAGNETIC RESONANCE IMAGING SYSTEM

(75) Inventors: Dashen Chu, Waukesha, WI (US);
Robert Stormont, Hartland, WI (US);
Scott Lindsay, Waukesha, WI (US);
Ricardo Mathias, Eaukesha, WI (US);
Craig Culver, Neosho, WI (US)

(73) Assignee: General Electric Company, Schenectady, NY (US)

( * ) Notice: Subject to any disclaimer, the term of this patent is extended or adjusted under 35 U.S.C. 154(b) by 811 days.

(21) Appl. No.: 13/276,127

(22) Filed: Oct. 18, 2011

(65) Prior Publication Data

US 2013/0093425 A1 Apr. 18, 2013

(51) Int. Cl.
| | |
|---|---|
| G01R 33/44 | (2006.01) |
| H01F 17/00 | (2006.01) |
| H01F 41/00 | (2006.01) |
| H01F 5/00 | (2006.01) |
| G01R 33/34 | (2006.01) |
| G01R 33/36 | (2006.01) |
| G01R 33/3415 | (2006.01) |

(52) U.S. Cl.
CPC ...... *G01R 33/34084* (2013.01); *G01R 33/3415* (2013.01); *G01R 33/34007* (2013.01); *G01R 33/365* (2013.01)

(58) Field of Classification Search
CPC ............ G01R 33/3415; G01R 33/365; G01R 33/34084; G01R 33/341; G01R 33/3621; G01R 33/3614; G01R 33/34007
USPC .................................................. 324/300–322
See application file for complete search history.

(56) References Cited

U.S. PATENT DOCUMENTS

| | | | |
|---|---|---|---|
| 5,477,146 A | 12/1995 | Jones | |
| 5,905,378 A | 5/1999 | Giaquinto | |
| 6,591,128 B1 * | 7/2003 | Wu et al. | 600/422 |
| 7,123,090 B2 * | 10/2006 | Ratzel | 330/165 |
| 7,365,542 B1 | 4/2008 | Rohling et al. | |
| 2002/0180442 A1 * | 12/2002 | Vij | 324/322 |
| 2007/0040555 A1 * | 2/2007 | Wohlfarth | 324/318 |
| 2008/0204021 A1 * | 8/2008 | Leussler et al. | 324/318 |
| 2010/0033177 A1 * | 2/2010 | Ochi et al. | 324/307 |
| 2010/0301862 A1 * | 12/2010 | Tropp et al. | 324/318 |
| 2011/0074420 A1 * | 3/2011 | Ladebeck | 324/318 |
| 2012/0319687 A1 * | 12/2012 | Chu et al. | 324/318 |

* cited by examiner

*Primary Examiner* — Melissa Koval
*Assistant Examiner* — Rishi Patel
(74) *Attorney, Agent, or Firm* — Dean Small; The Small Patent Law Group, LLC

(57) ABSTRACT

A radio frequency (RF) coil array that includes an RF coil support structure, and a plurality of RF coils coupled to the RF coil support structure, the RF coil support structure configured to enable the plurality of RF coils to be positioned in an underlap configuration and repositioned to an overlap configuration. A medical imaging system and a method of manufacturing the RF coil array are also described herein.

20 Claims, 9 Drawing Sheets

RADIO FREQUENCY (RF) COIL ARRAY FOR A MAGNETIC RESONANCE IMAGING SYSTEM

BACKGROUND OF THE INVENTION

The subject matter disclosed herein relates generally to magnetic resonance imaging (MRI) systems, and more particularly to a radio frequency (RF) coil array used with a MRI imaging system.

MRI imaging systems use RF coils to acquire image information of a region of interest of a scanned object. The resultant image that is generated shows the structure and function of the region of interest. At least one conventional MRI imaging system includes a multiple-channel array coil having a plurality of coil elements. The signals detected by the multiple-channel array coil are processed by a computer to generate MR images of the object being imaged. During operation, the plurality of coil elements are inductively or capacitively decoupled from the other coil elements. In many cases, inductive decoupling through overlapping of the RF coil elements is preferred. More specifically, in an overlapping configuration, a portion of an RF coil overlaps a portion of an adjacent RF coil. However, in some cases coil underlapping is preferred. In an underlapping configuration, each RF coil is separated from an adjacent RF coil.

Conventionally, good isolation in an overlapped configuration has been achieved using critical coupling wherein the RF coils are overlapped a predetermined distance. Good isolation in an underlapped configuration is typically achieved using transformers disposed between adjacent RF coils. In each of the overlapped and underlapped configurations, the spacing between the RF coils is fixed or pre-determined. Thus, the overall coverage of a conventional RF coil is also fixed. However, RF arrays are typically sized to be utilized with a patient having an average size. Thus, if the patient is larger or smaller than the average patient, the RF coil array may be too large or too small to properly fit the patient. As a result, in operation the RF coil may not provide sufficient information of the patient being imaged. To accommodate larger and smaller patients, some medical facilities may choose to purchase RF array coils having different sizes to accommodate patients having different sizes. However, the costs of such RF coils arrays may limit the quantity of medical providers capable of expending the additional financial resources required to purchase RF coil arrays having different sizes.

BRIEF DESCRIPTION OF THE INVENTION

In one embodiment, a radio frequency (RF) coil array is provided. The RF coil array includes an RF coil support structure, and a plurality of RF coils coupled to the RF coil support structure, the RF coil support structure configured to enable the plurality of RF coils to be positioned in an underlap configuration and repositioned to an overlap configuration.

In another embodiment, a magnetic resonance imaging (MRI) system is provided. The MRI system includes a gantry having a bore extending therethrough and a radio frequency (RF) coil array configured to be inserted into the bore. The RF coil array includes an RF coil support structure, and a plurality of RF coils coupled to the RF coil support structure, the RF coil support structure configured to enable the plurality of RF coils to be positioned in an underlap configuration and repositioned to an overlap configuration.

In a further embodiment, a method of manufacturing a radio frequency (RF) coil array is provided. The method includes coupling a plurality of RF coils to a support structure such that the plurality of RF coils are enables the plurality of RF coils to be positioned in an underlap configuration and repositioned to an overlap configuration.

DETAILED DESCRIPTION OF THE INVENTION

Figure 1:
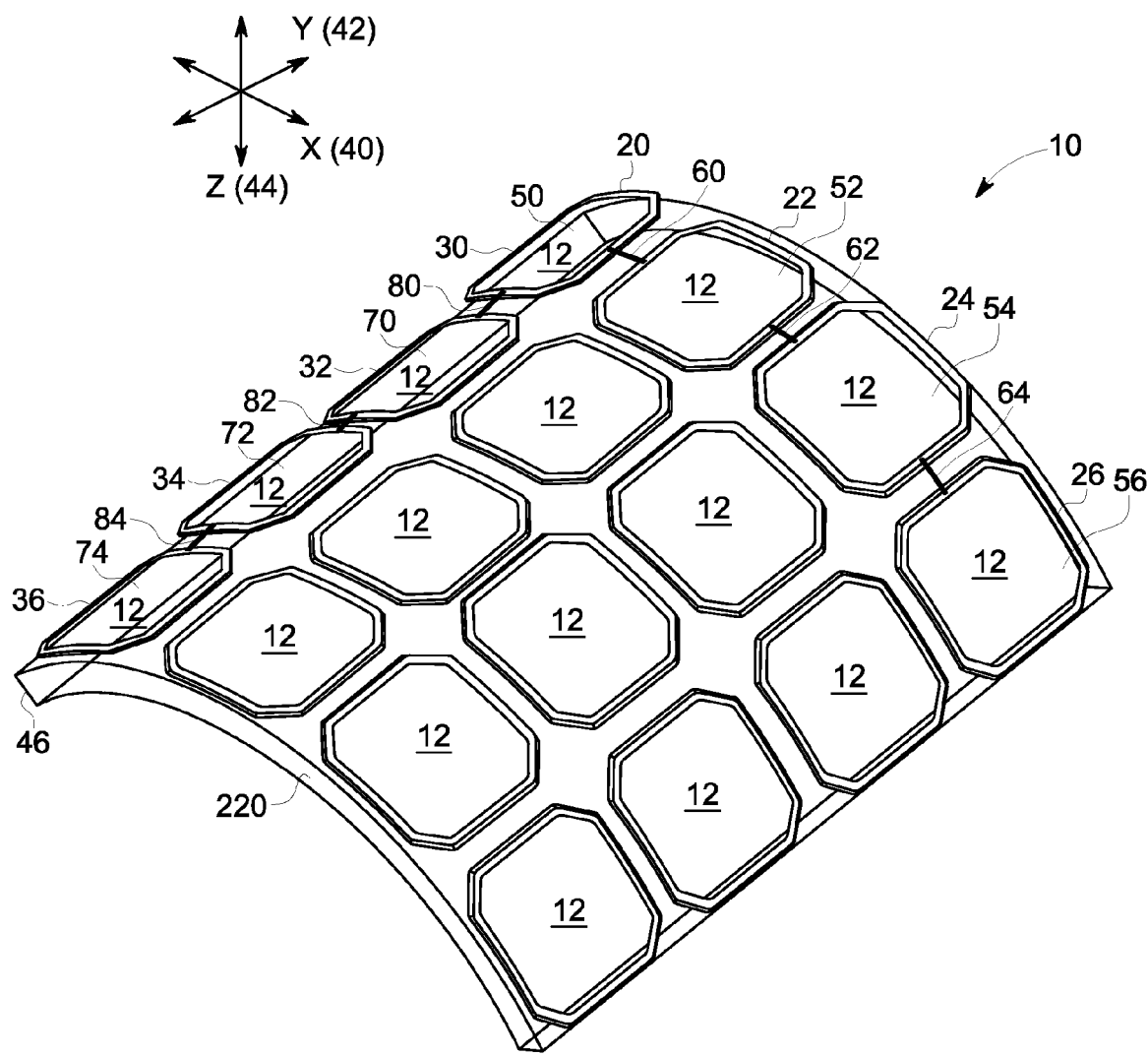
FIG. 1 is a perspective view of an exemplary radio frequency (RF) coil array in a first operational configuration and formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments described herein provide a radio frequency (RF) coil array that may be utilized with an MRI imaging system. By practicing at least one embodiment, the RF coil array may be expanded or retracted to accommodate patients of various sizes. The RF coil array includes a plurality of individual RF coils that are mechanically coupled together using a flexible support structure. The flexible support structure provides three-dimensional (3D) spacing adjustments between the individual RF coils to accommodate patient's of various sizes as well as to accommodate patient's having various anatomical shapes.

FIG. 1 is a top perspective view of an exemplary RF coil array 10 formed in accordance various embodiments. The RF coil array 10 includes a plurality of individual RF coils 12 that are arranged in rows and columns to form an m×n matrix of RF coils 12, wherein n and m are any integer value. In the exemplary embodiment, the RF coils 12 are surface coil elements that have a generally square shape. In various other embodiments, the RF coils 12 may have a shape other than square. For example, the RF coils 12 may have a rectangular shape, a hexagonal shape, a round shape, etc. The RF coils 12 are arranged in rows and columns. For example, the RF coil array 10 may have a first column 20, a second column 22, a third column 24, and an nth column. The RF coil array 10 may also have a first row 30, a second row 32, a third row 34, and an nth row. It should be realized that although various embodiments described the RF coil array 10 as having four columns and rows, the RF coil array 10 may have more or less than four columns and/or rows. Moreover, the RF coil array 10 may have a greater or a fewer number of columns or rows. In the exemplary embodiment, the RF coils 12 are symmetrically arranged with one another and displaced from one another with respect to an x-axis 40. Moreover, the RF coils 12 are symmetrically arranged with one another and displaced from one another with respect to a y-axis 42.

In the exemplary embodiment, the RF coils 12 are generally square in shape, and are formed from a generally flexible, flat, conductive material, for example, tin-plated copper. It should be realized that the RF coil array 10 may be used with other RF coils (not shown). For example, the RF coil array 10 may be used to image a posterior section of a patient, whereas another array coil (not shown) may be disposed over or under the RF coil array 10 to image an anterior portion of the patient.

In various embodiments, the RF coils 12 may mounted on a flexible substrate 46. The flexible substrate 46 may be fabricated from a substantially RF transparent material. For example, the substrate 46 may be fabricated from a cloth material or any other suitable material that is flexible to enable the RF coils 12 to be repositioned as described herein. Thus, the RF coil array 10 may be formed as a blanket-type device that is deformable in an x-direction, a y-direction, and a z-direction to enable the operator to expand, contract, or bend the RF coil array 10 to conform to an individual patient being imaged. More specifically, the RF coils 12 may be attached to each other using, for example, hook and loop devices, snaps, clips or similar attachment devices. Optionally, the RF coils 12 may be formed integrally with the flexible substrate 46.

In operation, the flexible substrate therefore enables the RF coils 12 to move, twist, translate, or deform in the x-axis 40 direction, the y-axis direction 42, and/or the z-axis direction 44. More specifically, the flexible substrate 46 enables the RF coils 12 to be moved closer together or further apart in only the x-direction 40. The flexible substrate 46 enables the RF coils 12 to be moved closer together or further apart in only the y-direction 42. The flexible substrate 46 also enables the RF coils 12 to moved closer together or further apart concurrently in the x-direction 40, the y-direction 42, and/or the z-direction 44. Accordingly, in various embodiments, the RF coils 12 may be physically separated from each other, also referred to herein as an underlap configuration, such that each RF coil 12 generates a distinct profile. Moreover, in various other embodiments, the RF coils 12 may be configured to at least partially overlap each other, also referred to herein as an overlap configuration. Additionally, the RF coils 12 may be arranged such that adjacent RF coils 12 contact each other but do not overlap each other. Once, the RF coil array 10 is in the desired configuration, e.g. overlapped, underlapped, or in between, the RF coil array 10 may include mechanical devices to facilitate maintaining the RF coil array 10 in the desired configuration. For example, the flexible substrate 46 may include hook and loop devices, snaps, clips or similar attachment devices to enable one portion of the RF coil array 10 to be mechanically coupled to another portion of the RF coil array 10 to maintain the RF coil array 10 in the desired configuration.

FIG. 1 illustrates the RF coil array 10 in a fully expanded or fully underlapped configuration. In the fully underlapped configuration, the RF coils 12 in each respective column 20, 22, 24, and Col$_n$ are separated by a gap. Moreover, the RF coils 12 in each respective row 30, 32, 34, and Row$_n$ are also separated by a gap. For example, an RF coil 50 is separated from an RF coil 52 by a gap 60, the RF coil 52 is separated from an RF coil 54 by a gap 62, and the RF coil 54 is separated from an RF coil 56 by a gap 64. Thus, in the fully underlapped configuration, the RF coils 12 are each separated by a gap in the y-direction 42.

Moreover, in the fully underlapped configuration, the RF coils 12 are each separated by a gap in the x-direction 40. For example, the RF coil 50 is separated from an RF coil 70 by a gap 80. The RF coil 70 is separated from an RF coil 72 by a gap 82 and the RF coil 72 is separated from an RF coil 74 by a gap 84.

In the exemplary embodiment, the gaps 60, 62, 64, 80, 82, and 84 and other gaps between the RF coils 12 are adjustable by the operator. For example, the operator may physically manipulate the RF coil array 10 to either increase or decrease the size of the gaps between the RF coils 12. More specifically, to configure the RF coil array 10 in the underlapped configuration, as shown in FIG. 1, the operator may grasp the edges of the flexible substrate 46 and pull, or otherwise manipulate, the RF coil array 10 until the RF coils 12 are separated by the desired gap. It should be realized that the RF coil array 10 may be manipulated such that the gaps between the RF coils 12 are substantially the same. Optionally, the operator may manipulate the RF coil array 10 to enable gaps of different sizes to be formed between the RF coils 12. For example, the RF coil array 10 may be configured such that the gaps between the RF coils in the columns 20, 22, 24, and 26, and Col$_n$ are substantially the same size. The RF coil array 10 may also be manipulated such that the gaps between the RF coils in the rows 30, 32, 34, and Row$_n$ are substantially the same size, but different than the size of the gaps in the columns 20, 22, 24, and Col$_n$.

Figure 2:
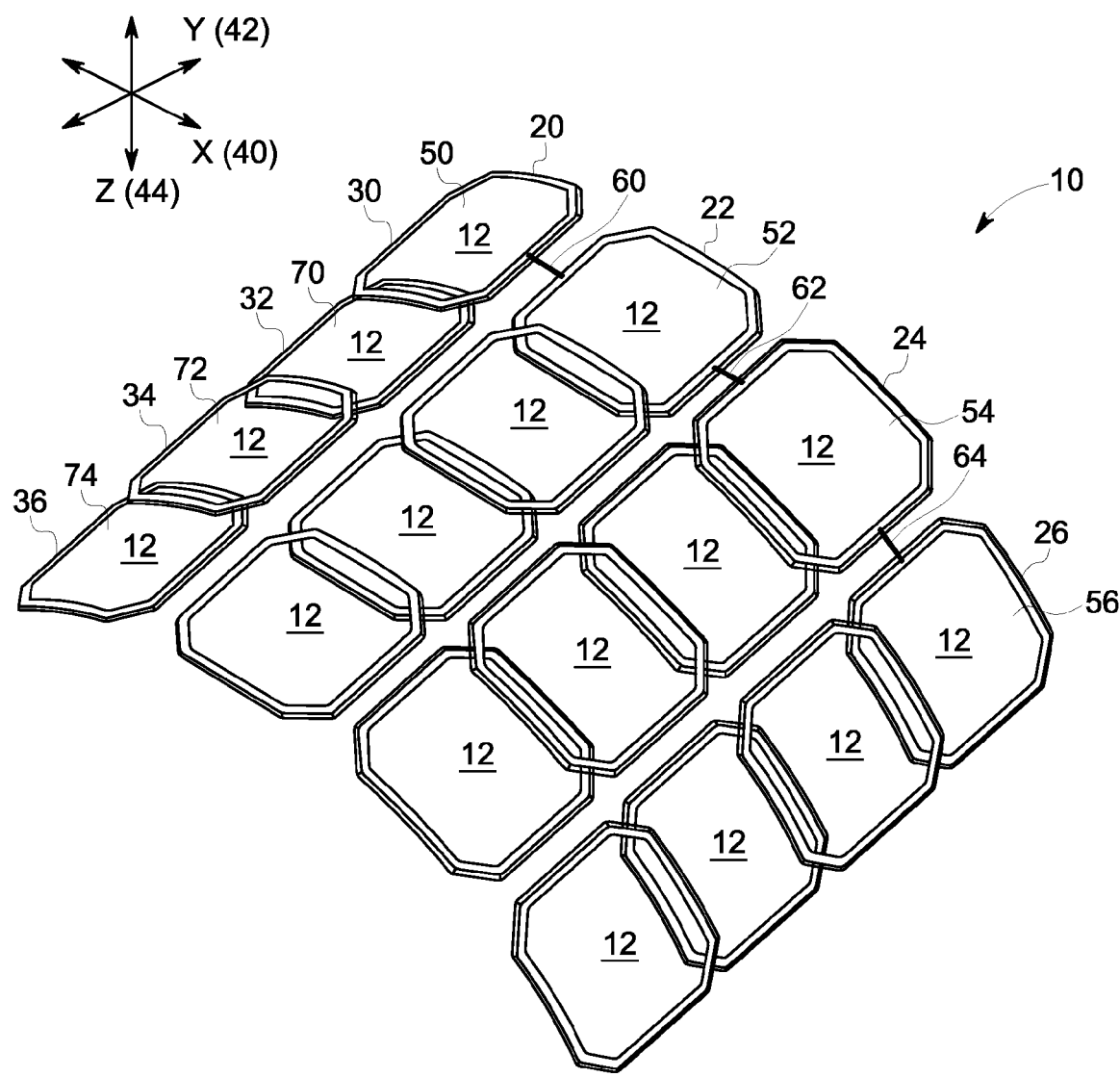
FIG. 2 is a plan view of the RF coil array shown in FIG. 1 in a second operational configuration.

FIG. 2 illustrates the RF coil array 10 may be arranged in an exemplary partially underlapped configuration, which may also be referred to herein as a partially overlapped configuration. In various embodiments, the gaps between the RF coils 12 are adjusted such that the RF coils 12 in each respective column are arranged in the underlapped configuration and the RF coils 12 in each respective row are arranged in the overlap configuration.

For example, in various embodiments, the to configure the RF coil array 10 in the partially underlapped configuration shown in FIG. 2, the RF coils 12 in at least one of the columns 20, 22, 24, and/or $Col_n$ are separated by a gap. For example, an RF coil 50 is separated from the RF coil 52 by the gap 60, the RF coil 52 is separated from the RF coil 54 by the gap 62, and the RF coil 54 is separated from the RF coil 56 by the gap 64.

Moreover, the RF coils 12 in at least one of the rows 30, 32, 34, and/or $Row_n$ are partially overlapped. For example, the RF coil 50 is at least partially overlapping the RF coil 70. The RF coil 70 is at least partially overlapping the RF coil 72 and the RF coil 72 is at least partially overlapping the RF coil 74. In the exemplary embodiment, the RF coils 12 may be overlapped between approximately zero percent and approximately thirty-eight percent.

In operation, the operator may physically manipulate the RF coil array 10 to either increase or decrease the size of the gaps between the RF coils 12 located in the columns 20, 22, 24, and/or $Col_n$. Moreover the operator may physically manipulate the RF coil array 10 to either increase or decrease the quantity of overlap of the RF coils 12 in the rows 30, 32, 34, and/or $Row_n$. It again should be realized that the RF coil array 10 may be manipulated such that the gaps between the RF coils 12 in the rows 30, 32, 34, and/or $Row_n$ in the partially underlapped configuration are substantially the same. Optionally, the operator may manipulate the RF coil array 10 to enable gaps of different sizes to be formed between the RF coils in the rows 30, 32, 34, and/or $Row_n$. Moreover, the RF coil array 10 may be manipulated such that the overlap between the RF coils 12 in the columns 20, 22, 24, and/or $Col_n$ in the partially underlapped configuration are substantially the same. Optionally, the operator may manipulate the RF coil array 10 to enable overlaps of different sizes to be formed between the RF coils in the columns 20, 22, 24, and/or $Col_n$.

Figure 3:
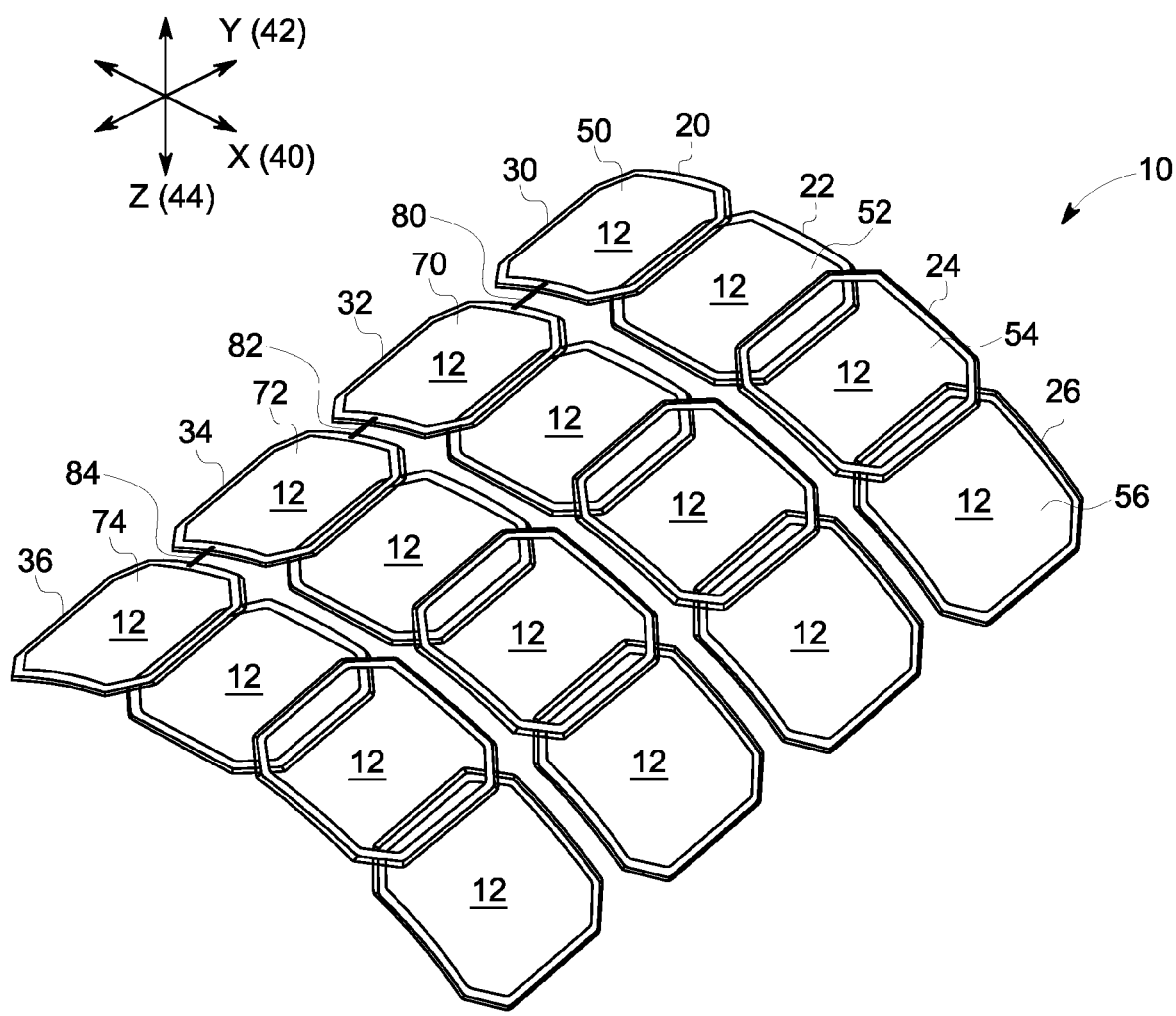
FIG. 3 is a plan view of the RF coil array shown in FIG. 1 in a third operational configuration.

FIG. 3 illustrates the RF coil array 10 being arranged in another exemplary partially underlapped configuration. In various embodiments, the gaps between the RF coils 12 are adjusted such that the RF coils 12 in each respective row are arranged in the underlapped configuration and the RF coils 12 in each respective column are arranged in the overlap configuration.

For example, in various embodiments, the RF coil array 10 may be configured in the partially overlapped configuration shown in FIG. 3, the RF coils 12 in at least one of the rows 30, 32, 34, and/or $Row_n$ are at least partially overlapped. For example, an RF coil 50 may at least partially overlap the RF coil 52, the RF coil 52 may at least partially overlap the RF coil 54, and the RF coil 54 may at least partially overlap the RF coil 56.

Moreover, the RF coils 12 in at least one of the columns 20, 22, 24, and/or $Col_n$ are separated by a gap. For example, the RF coil 50 may be separated from the RF coil 70 by the gap 80. The RF coil 70 may be separated from the RF coil 72 by a gap 82, and the RF coil 72 may be separated from the RF coil 74 by the gap 84. In the exemplary embodiment, the RF coils 12 may be overlapped between approximately zero percent and approximately thirty-eight percent.

In operation, the operator may physically manipulate the RF coil array 10 to either increase or decrease the size of the gaps between the RF coils 12 located in the rows 30, 32, 34, and/or $Row_n$ as discussed above. Moreover the operator may physically manipulate the RF coil array 10 to either increase or decrease the quantity of overlap of the RF coils 12 in the columns 20, 22, 24, and/or $Col_n$ as discussed above.

Figure 4:
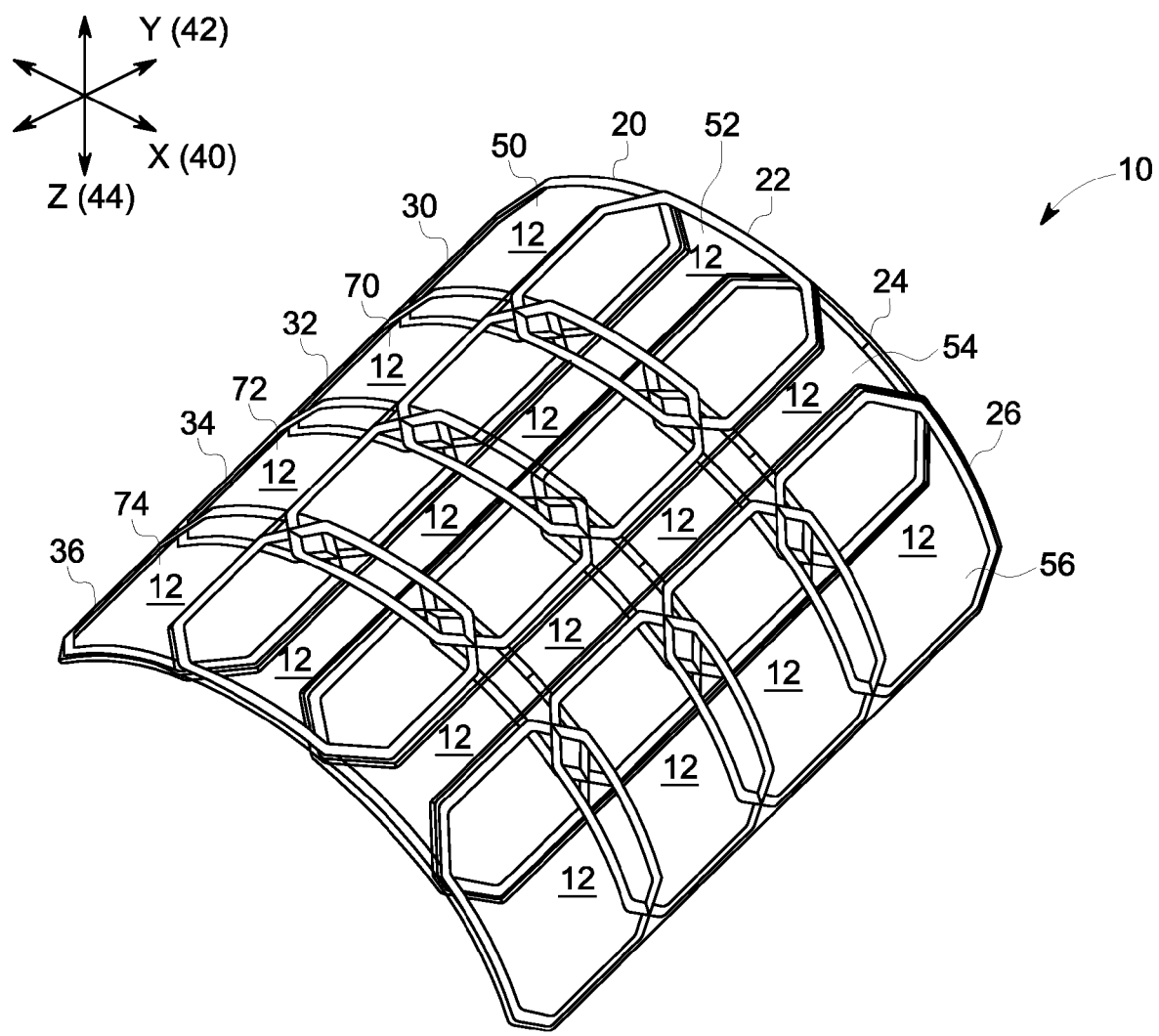
FIG. 4 is a plan view of the RF coil array shown in FIG. 1 in a fourth operational configuration.

FIG. 4 illustrates the RF coil array 10 being arranged in an underlapped configuration. In various embodiments, the RF coils 12 are adjusted such that the RF coils 12 in each respective row and column are arranged in the underlapped configuration.

For example, in various embodiments, to configure the RF coil array 10 in the underlapped configuration shown in FIG. 4, the RF coils 12 in at least one of the rows 30, 32, 34, and/or $Row_n$ are at least partially underlapped. For example, an RF coil 50 may at least partially overlap the RF coil 52, the RF coil 52 may at least partially overlap the RF coil 54, and the RF coil 54 may at least partially overlap the RF coil 56.

Moreover, the RF coils 12 in at least one of the columns 20, 22, 24, and/or $Col_n$ may partially overlap. For example, the RF coil 50 may partially overlap the RF coil 70. The RF coil 70 may partially overlap RF coil 72, and the RF coil 72 may partially overlap RF coil 74. In the exemplary embodiment, the RF coils 12 may be overlapped between approximately zero percent and approximately thirty-eight percent.

In operation, the operator may physically manipulate the RF coil array 10 to either increase or decrease the size of the overlaps between the RF coils 12 located in the rows 30, 32, 34, and/or $Row_n$ as discussed above. Moreover the operator may physically manipulate the RF coil array 10 to either increase or decrease the size of overlap of the RF coils 12 in the columns 20, 22, 24, and/or $Col_n$ as discussed above.

Figure 5:
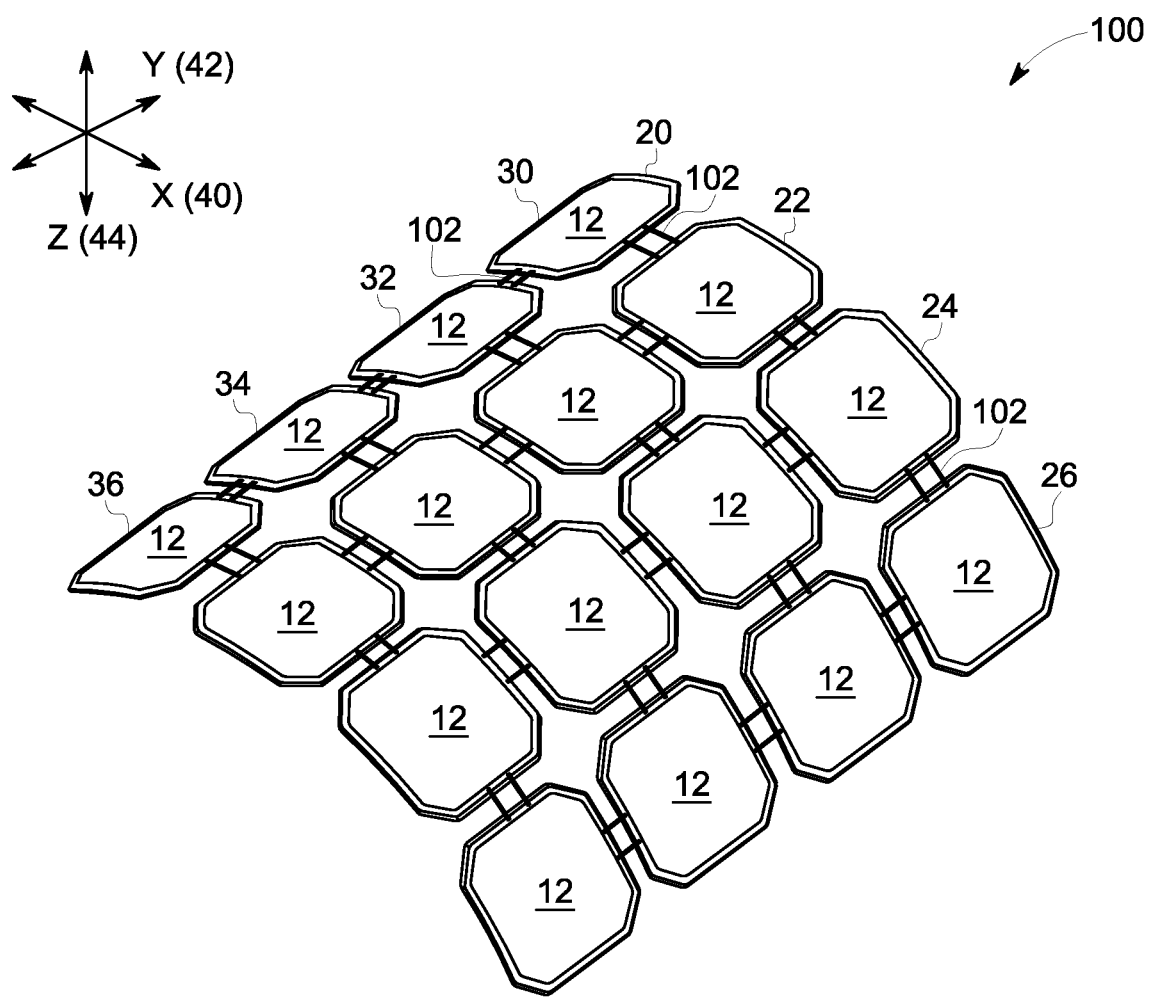
FIG. 5 is a plan view of another exemplary RF coil array in a first operational configuration and formed in accordance with various embodiments.

FIG. 5 is a plan view of another exemplary RF coil array 100 formed in accordance various embodiments. The RF coil array 100 is substantially similar to the RF coil array 10 shown in FIGS. 1-4. The RF coil array 100 includes a plurality of individual RF coils 12 that are arranged in rows and columns to form an m×n matrix of RF coils 12. In the exemplary embodiment, the RF coils 12 are surface coil elements that have a generally square shape. In various other embodiments, the RF coils 12 may have a shape other than square. For example, the RF coils 12 may have a rectangular shape, a hexagonal shape, a round shape, etc. The RF coils 12 are arranged in rows and columns. For example, the RF coil array 100 may have the first column 20, the second column 22, the third column 24, and the nth column, $Col_n$. The RF coil array 100 may also have the first row 30, the second row 32, the third row 34, and the nth row. It should be realized that although various embodiments describe the RF coil array 100 as having four columns and rows, the RF coil array 100 may have more or less than four columns and/or rows. Moreover, the RF coil array 100 may have a greater or a fewer number of columns than rows. In the exemplary embodiment, the RF coils 12 are symmetrically arranged with one another and displaced from one another with respect to an x-axis 40. Moreover, the RF coils 12 are symmetrically arranged with one another and displaced from one another with respect to a y-axis 42.

In various embodiments, the RF coils 12 may be mechanically coupled together using a plurality of mechanical devices 102. The mechanical devices 102 may be flexible mechanical devices that are fabricated from a cloth material or any other suitable material that is flexible to enable the RF coils 12 to be repositioned as described herein. More specifically, the mechanical devices may include, for example, hook and loop devices, snaps, clips or similar attachment devices. Thus, the RF coil array 100 may be formed as a blanket-type device that is deformable in an x-direction, a y-direction, and a z-direction to enable the operator to expand, contract, or bend the RF coil array 100 to conform to an individual patient being imaged similar to the RF coil array 10 described above.

Figure 6:
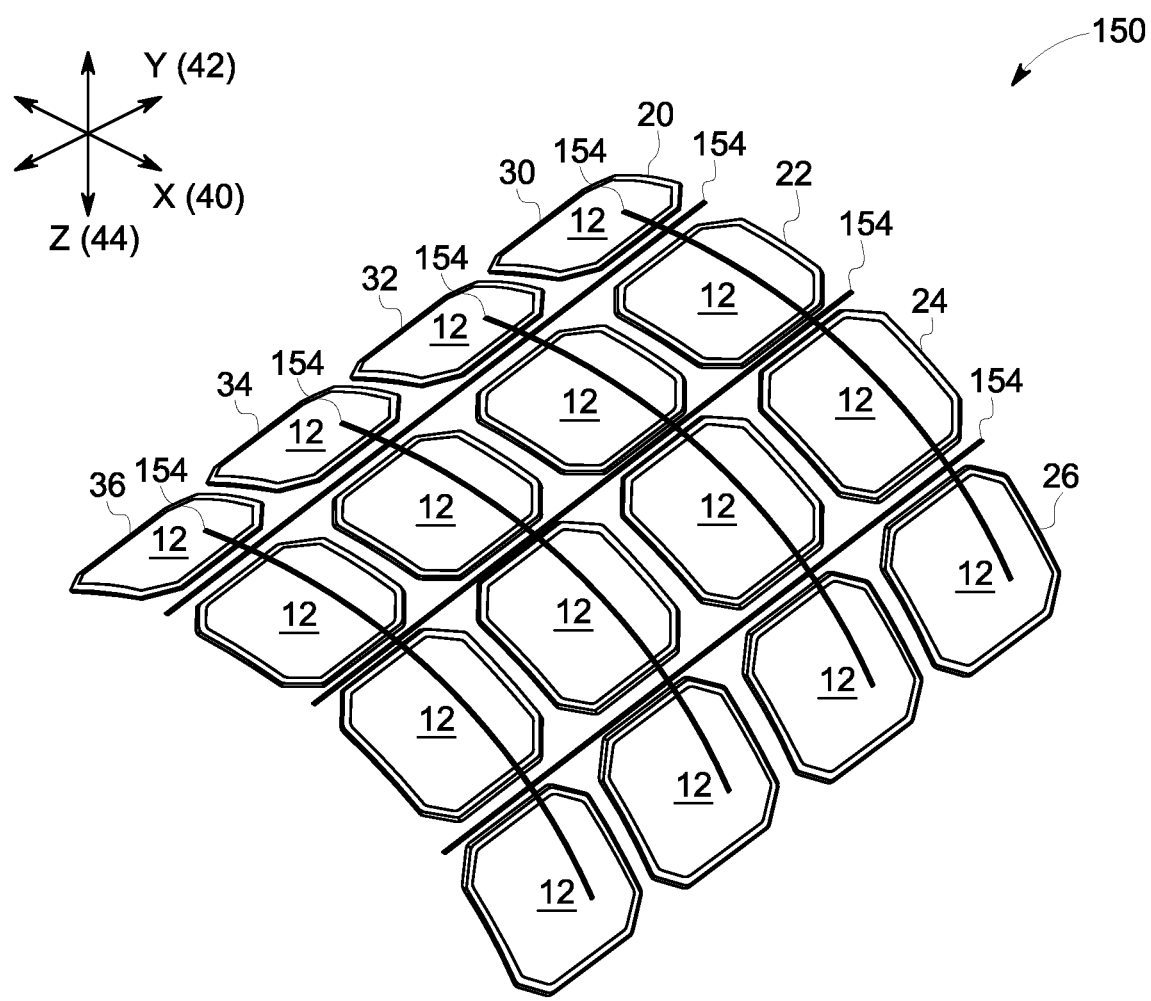
FIG. 6 is a plan view of yet another exemplary RF coil array in a first operational configuration and formed in accordance with various embodiments.

FIG. 6 is a plan view of another exemplary RF coil array 150 formed in accordance various embodiments. The RF coil array 150 is substantially similar to the RF coil array 10 shown in FIGS. 1-4 and the RF coil array 100 shown in FIG. 5. The RF coil array 150 includes a plurality of individual RF coils 12 that are arranged in rows and columns to form an n×n matrix of RF coils 12. In the exemplary embodiment, the RF coils 12 are surface coil elements that have a generally square shape. In various other embodiments, the RF coils 12 may have a shape other than square. For example, the RF coils 12 may have a rectangular shape, a hexagonal shape, a round shape, etc. The RF coils 12 are arranged in rows and columns. For example, the RF coil array 150 may have the first column 20, the second column 22, the third column 24, and an the nth column. The RF coil array 150 may also have the first row 30, the second row 32, the third row 34, and the nth row. It should be realized that although various embodiments described the RF coil array 150 as having four columns and rows, the RF coil array 150 may have more or less than four columns and/or rows. Moreover, the RF coil array 150 may have a greater or a fewer number of columns than rows. In the exemplary embodiment, the RF coils 12 are symmetrically arranged with one another and displaced from one another with respect to an x-axis 40. Moreover, the RF coils 12 are symmetrically arranged with one another and displaced with respect to the y-axis 42 and/or the z-axis 44. The RF coils 12 may be mechanically coupled together using a mechanical system 152.

In various embodiments mechanical system 152 may include a plurality of rails 154 that are arranged in the x-direction 40 and the y-direction 42. In the exemplary embodiment, each of the RF coils 12 is coupled to at least one of the mechanical rails 154 to enable the RF coils to move in the x-direction 40, the y-direction 42, and the z-direction 44. The rails 154 may be flexible mechanical devices that are fabricated from a cloth material or any other suitable material that is flexible to enable the RF coils 12 to be repositioned as described herein. In the exemplary embodiment, the RF coils 12 may be attached to the rails 154 using, for example, hook and loop devices, snaps, clips or similar attachment devices. Moreover, the mechanical devices may enable the RF coils 12 to be removably coupled to the rails 154. For example, the mechanical devices may be configured to enable the operator to add additional RF coils 12 to the RF coil array 12. Optionally, the mechanical devices may enable the operator to remove and/or replace various RF coils. Thus, the RF coil array 150 may be formed as a blanket-type device that is deformable in an x-direction, a y-direction, and a z-direction to enable the operator to expand, contract, or bend the RF coil array 150 to conform to an individual patient being imaged similar to the RF coil arrays 10 and 100 described above.

Figure 7:
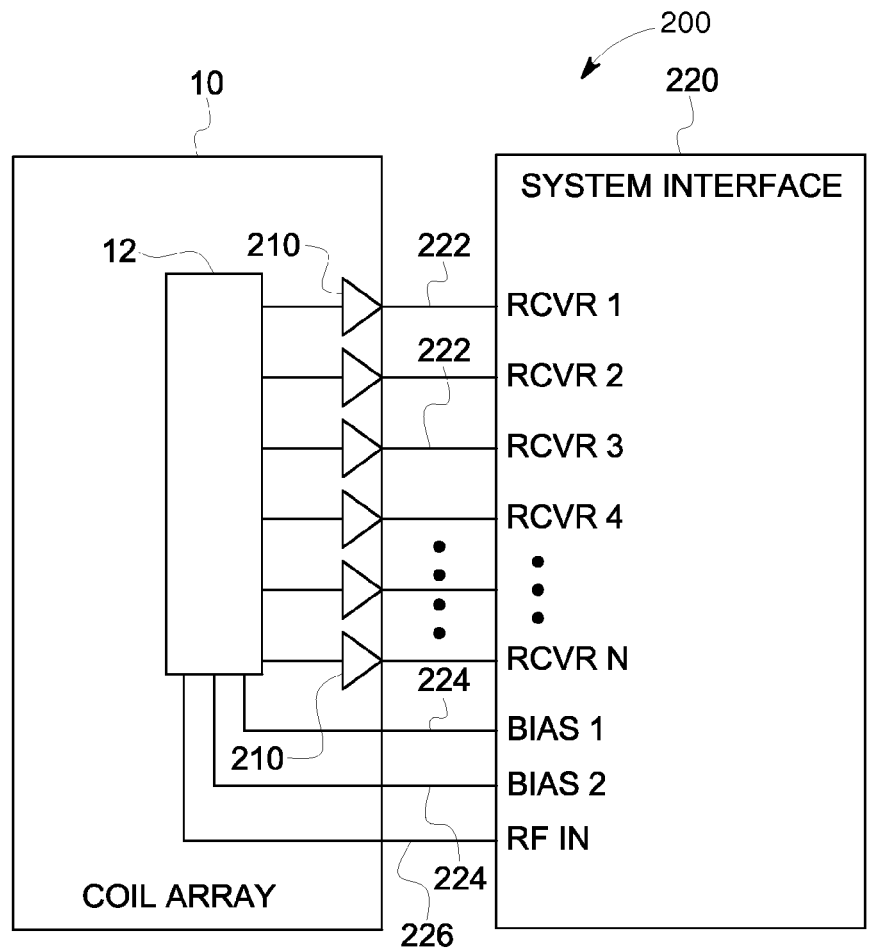
FIG. 7 is a block diagram of an embodiment of a receive section of a magnetic resonance imaging (MRI) system including the RF coil array shown in FIG. 1.

FIG. 7 is a block diagram of an embodiment of a receive section of a magnetic resonance imaging (MRI) system including the RF coil array 10 shown in FIG. 1. It should be realized that although the receive section is described with respect to the RF coil array 10. The receive section may be utilized with any of the RF coil arrays described herein.

As illustrated in FIG. 7, various embodiments may be implemented in connection with a receive section 200 of an MRI system. The receive section 200 is configured to acquire MR data using an RF coil array such as the RF coil arrays 10, 100 and 150 described herein. As discussed, the RF coil array 10 that includes a plurality of RF receiver coils 12 (illustrated as a single block element in FIG. 7 for simplicity). For example, the RF coil array 10 may include a plurality of loop elements that form the RF receiver coils 12. The RF receiver coils 12 are configured to detect MR signals. It should be noted that the RF receiver coils 12, for example adjacent loop elements, may be overlapped to reduce or minimize coupling, underlapped, or partially underlapped as described herein. The RF receiver coils 12 are also isolated from each other using preamplifiers 210 that also amplify received MR signals from the RF receiver coils 12. In the exemplary embodiment, the RF coil array 10 is a dedicated receive only coil array. Alternatively, the RF coil array 10 is a switchable array, such as a switchable transmit/receive (T/R) phased array coil. Portions and/or an entirety of the receive section 200 may be referred to herein as a "system".

Thus, the RF coil array 10 forms part of the multi-channel receive section 200 connected to an MRI system. The receive section 200 includes a plurality of channels (Rcvr 1 ... Rcvr N), for example, sixteen channels. However, it should be noted that more or less channels may be provided based on the quantity of RF coils 12 utilized to form the RF coil array 10. In the exemplary embodiment, the RF coil array 10 is connected to the multi-channel receive section 200 having a multi-channel system interface 220 (e.g., a 1.5T System Interface), with a separate receive channel 222 connected to each one of the plurality of the RF receiver coils 12 (e.g., sixteen channels connected to a four by four coil array).

The system interface 220 may include a plurality of bias control lines 224 (illustrated as two lines) to control the switching of decoupling circuits (not shown), which may be controlled, for example, using a coil configuration file stored in the MRI system and/or based on a user input. For example, based on a user input, a particular coil configuration file may be selected to control the RF coil array 10 configured as a T/R phased array coil in a particular imaging mode (e.g., user control of mode of operation using controls on an MRI scanner). An RF IN control line 226 also may be provided in connection with, for example, a combiner (not shown) to control a transmit coil array.

Figure 8:
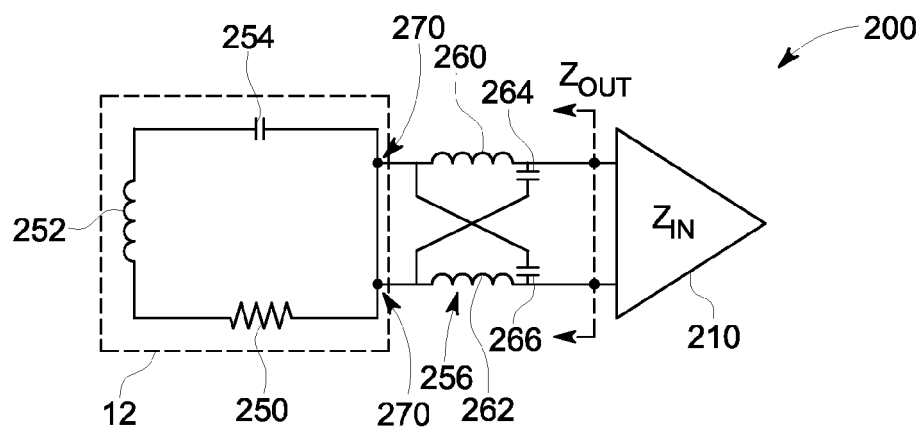
FIG. 8 is a schematic diagram of a portion of the receive section shown in FIG. 7 illustrating an embodiment of a RF receiver coil and an embodiment of a corresponding pre-amplifier of the receive section.
Figure 9:
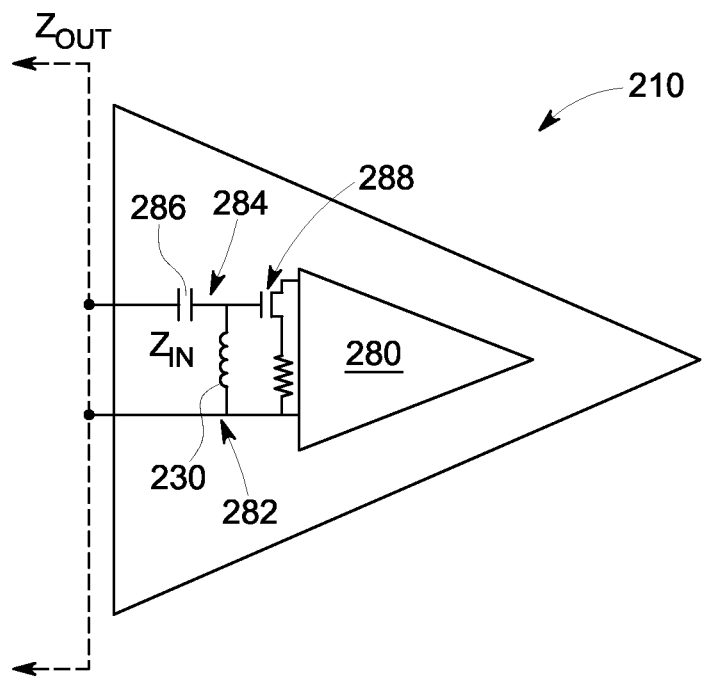
FIG. 9 is a schematic diagram illustrating an embodiment of the preamplifier shown in FIG. 8.

FIG. 8 is a schematic diagram of a portion of the receive section 200 illustrating an embodiment of one of the RF receiver coils 12 and an embodiment of a corresponding pre-amplifier 210. In the exemplary embodiment, the preamplifier 210 has a relatively low input impedance. For example, in some embodiments, a "relatively low" input impedance of the preamplifier 210 is less than approximately 5 ohms at resonance frequency. The input impedance of the preamplifier 210 is defined by an inductor 230, which is shown in FIG. 9. Referring again to FIG. 8, the input impedance of the preamplifier 210 is represented by $Z_{IN}$. In some embodiments, the preamplifier 210 has an input impedance of between approximately 1 ohm and approximately 3 ohms at resonance frequency. Moreover, in some embodiments, the preamplifier 210 has an input impedance of approximately 2 ohms at resonance frequency. It should be noted that for purposes of illustration, all of the capacitors are considered lossless and the inductors are represented with a series resistance. The input impedance of the preamplifier 210 may be referred to herein as a "preamplifier input impedance".

The RF receiver coil 12 includes an RLC resonant circuit formed from a resistor 250, an inductor 252, and a capacitor 254. The RF receiver coil 12 is also connected in series to an impedance transformer 256. More specifically, the impedance transformer 256 is electrically connected between the RF receiver coil 12 and the preamplifier 210. The impedance transformer 256 forms an impedance matching network between the RF receiver coil 12 and the preamplifier 210. The impedance transformer 256 is configured to transform a coil impedance of the RF receiver coil 12 into a source impedance of the preamplifier 210. The source impedance of the preamplifier 210 is represented in FIG. 8 by $Z_{OUT}$. The coil impedance of the RF receiver coil 12 may have any value, which may be dependant on coil loading, coil size, field strength, and/or the like. Examples of the coil impedance of the RF receiver coil 12 include, but are not limited to, between approximately 2 ohms and approximately 10 ohms at 1.5T field strength, and/or the like.

In one exemplary embodiment, the impedance transformer 256 includes a lattice-type balun. More specifically, the impedance transformer 256 includes two inductors 260 and 262 and two capacitors 264 and 266. The inductor 260 is connected in series to the capacitor 264, while the inductor 262 is connected in series with the capacitor 266. The inductor 260 and the capacitor 264 are connected in parallel to the inductor 262 and the capacitor 266. In the exemplary embodiment, the arrangement of the lattice-type balun impedance transformer 256 produces a +/−90° phase shift. Each of the inductors 260 and 262 may be referred to herein as a "first" and/or a "second" inductor. The capacitors 264 and 266 may be referred to herein as a "first" and/or a "second" capacitor.

The impedance transformer 256 is configured to transform the coil impedance of the RF receiver coil 12 into a relatively high source impedance $Z_{OUT}$. For example, in some embodiments, a "relatively high" source impedance $Z_{OUT}$ is at least approximately 100 ohms. Accordingly, in the exemplary embodiment, the impedance transformer 256 is configured to transform the coil impedance of the RF receiver coil 12 into a source impedance $Z_{OUT}$ of at least approximately 100 ohms. In some embodiments, the impedance transformer 256 is configured to transform the coil impedance of the RF receiver coil 12 into a source impedance $Z_{OUT}$ of at least approximately 300 ohms, at least approximately 400 ohms, or at least approximately 500 ohms. Exemplary values for the inductors 260 and 262 include, but are not limited to, approximately 123.5 nH. Exemplary values for the capacitors 264 and 266 include, but are not limited to, approximately 51 pF.

The impedance transformer 256 also provides a blocking impedance to the RF receiver coil 12. Transformation of the coil impedance of the RF receiver coil 12 to a relative high source impedance $Z_{OUT}$ may enable the impedance transformer 256 to provide a higher blocking impedance to the RF receiver coil 12. Because the relatively high source impedance $Z_{OUT}$ of the preamplifier 210 is greater than, for example, the conventional value of approximately 50 ohms, the reactance X of the inductors 260 and 262 and the capacitors 264 and 266 of the impedance transformer 256 are increased. For example, the reactance $X_C$ of each of the capacitors 264 and 266 and the reactance $X_L$ of each of the inductors 260 and 262 can be defined by the equation: $X_C = X_L = \sqrt{(R_1 \times R_2)}$; where $R_1$ is the coil impedance and $R_2$ is the source impedance $Z_{OUT}$. Because the input impedance $Z_{IN}$ of the preamplifier 210 is relatively low, the impedance transformer 256 forms a parallel resonance circuit that results in a higher impedance at an output 270 of the RF receiver coil 12. As the reactances $X_C$ and $X_L$ increase, the blocking impedance increases because the blocking impedance is directly proportional to the values of $X_C$ and $X_L$. The higher blocking impedance suppresses an increased amount of RF current along the RF receiver coil 12, which may ultimately result in a higher SNR ratio because of fewer interactions between RF receiver coils 12 and/or less correlated noise. Exemplary values for such higher blocking impedances include, for example, a blocking impedance of at least 500 ohms, and at least 1000 ohms.

The impedance transformer 256 is not limited to a lattice-type balun structure for transforming the coil impedance of the RF receiver coil 12 into a relatively high source impedance. Rather, any components and arrangement of the connections therebetween may be used to transform the coil impedance of the RF receiver coil 12 into a relatively high source impedance, such as, but not limited to, other types of equivalent phase shift baluns, and/or the like.

FIG. 9 is a schematic diagram illustrating an embodiment of the preamplifier 210 shown in FIG. 7. The preamplifier 210 is configured to accommodate the relatively high source impedance $Z_{OUT}$ while providing the relatively low input impedance $Z_{IN}$. The input impedance $Z_{IN}$ of the preamplifier 210 is defined by the inductor 230 of the preamplifier 210. The preamplifier 210 includes an amplifier 280 that receives MR signals from the corresponding RF receiver coil 12 and amplifies the received MR signals. An input circuit 282 is electrically connected to the amplifier 280. The input circuit 282 is electrically connected to the output 270 (shown in FIG. 8) of the corresponding RF receiver coil 12, via the impedance transformer 256 (shown in FIG. 8). The input circuit 282 is configured to transmit the MR signals from the corresponding RF receiver coil 12 to the amplifier 280.

The input circuit 282 includes an impedance transformer 284, which includes a capacitor 286 and the inductor 230. The input circuit 282 also includes a field effect transistor (FET) 288 that is electrically connected between the impedance transformer 284 and the amplifier 280, for example as shown in FIG. 8. The impedance transformer 284 is electrically connected between the amplifier 280 and the corresponding RF receiver coil 12.

In the exemplary embodiment, the FET 288 has a relatively large noise circle, which may be centered in the Smith Chart, for the FET 288 to yield a relatively low noise figure. In other words, the FET 288 is capable of providing a relatively low noise figure over a relatively broad range of source impedance $Z_{OUT}$. For example, in some embodiments, a "relatively large" size of the noise circle of the FET 288 is at least approximately 0.3 decibels. In some embodiments, the noise circle of the FET 288 has a size of at lest approximately 0.6 decibels. The size of the noise circle of the FET 288 is dependent on the noise resistance $R_N$ of the FET 288. The FET 288 may have any value of noise resistance $R_N$ that provides a noise circle having a size of at least 0.3 decibels, such as, but not limited to, less than approximately 0.03 ohms, equal to or less than approximately 0.02 ohms, and/or the like. The location of the noise circle of the FET 288 within the Smith Chart is dependant on the optimum reflection coefficient of the FET 288. For example, the noise circle of the FET 288 may be located closer to the center of the Smith Chart (i.e., closer to being concentric) when the optimum reflection coefficient of the FET 288 is less than approximately 100 ohms. In some embodiments, the noise circle of the FET 288 is centered within the Smith Chart (i.e., concentric with the Smith Chart). In some embodiments, and for example, the FET 288 has an optimum reflection coefficient of less than approximately 100 ohms. In some embodiments, and for example, the FET 288 has an optimum reflection coefficient of between approximately 40 ohms and approximately 60 ohms, for example approximately 50 ohms.

Figure 10:
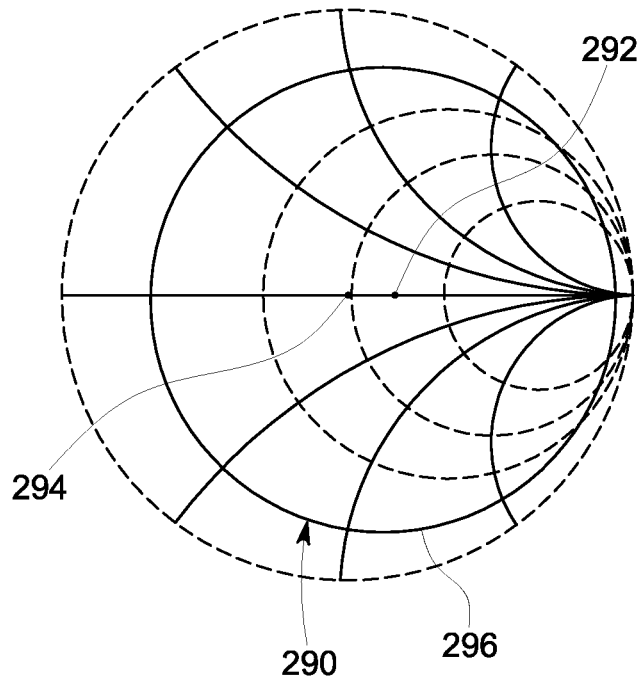
FIG. 10 is a graphical illustration of an embodiment of a Smith Chart for an embodiment of a field effect transistor (FET) of the preamplifier shown in FIGS. 8 and 9.

FIG. 10 is a graphical illustration of an embodiment of a Smith Chart for the FET 288 (shown in FIG. 9). In the exemplary embodiment of FIG. 10, the FET 288 has noise resistance $R_N$ of approximately 0.02 ohms and an optimum reflection coefficient of approximately 50 ohms. A noise circle 290 of the FET 288 as shown in FIG. 10 has a size of approximately 0.6 decibels. As can be seen in FIG. 10, a center 292 of the noise circle 290 of the FET 288 is relatively close to a center 294 of the Smith Chart. By "relatively close" it is meant that the center 294 of the Smith Chart lies within the circumference 296 of the noise circle 290. In some alternative embodiments, the center 294 of the Smith Chart is aligned with the center 292 of the noise circle 290 such that the Smith Chart and the noise circle 290 are concentric.

Referring again to FIG. 9, the impedance transformer 284 is configured to transform the relatively high source impedance $Z_{OUT}$ provided by the impedance transformer 256 into an impedance that is within the noise circle (e.g., the noise circle 290 (shown in FIG. 10) of the FET 288. In other words, the impedance transformer 284 is configured to transform a source impedance $Z_{OUT}$ of at least approximately 100 ohms into an impedance that is within the noise circle of the FET 288. For example, in some embodiments, the impedance transformer 284 is configured to transform a source impedance $Z_{OUT}$ of at least approximately 300 ohms, at least approximately 400 ohms, or at least approximately 500 ohms into an impedance that is within the noise circle of the FET 288. The relatively large noise circle of the FET 288 enables the impedance transformer 284 to form an LC series resonance while transforming the relatively high source impedance $Z_{OUT}$ into an impedance that is within the noise circle. The impedance within the noise circle that the impedance transformer 284 transforms the relatively high source impedance $Z_{OUT}$ into is selected for optimum noise matching, i.e., to yield a reduced or minimum noise figure, which may increase the SNR of the RF receiver coil 12.

The impedance transformer 284 is also configured to transform the impedance of the FET 288 into the relatively low input impedance $Z_{IN}$ of the preamplifier 210. In other words, the impedance transformer 284 is configured to transform the impedance of the FET 288 into an input impedance $Z_{IN}$ of less than approximately 5 ohms. For example, in some embodiments the impedance transformer 284 is configured to transform the impedance of the FET 288 into an input impedance $Z_{IN}$ of between approximately 1 ohm and approximately 3 ohms, for example approximately 2 ohms. The impedance of the FET 288 may have any value, such as, but not limited to, at least approximately 1,000 ohms, at least approximately 500,000 ohms, at least approximately 1,000,000 ohms, and/ or the like. Exemplary values of the inductor 230 include, but are not limited to, approximately 4.4 pF. Exemplary values of the capacitor 286 include, but are not limited to, approximately 515 nH. The impedance of the FET 288 may be referred to herein as "FET impedance".

In various embodiments described herein, an RF coil array utilizes high decoupling impedance pre-amplifiers to operate expandable and flexible multipurpose RF coil arrays. In various embodiments, the RF coil array includes multiple coil elements and is manufactured such that each coil element is independent and lightly tethered mechanically to adjacent coil elements. This independent-lightly tethered mechanism provides three dimensional spacing adjustments to accommodate various patient size difference as well to accommodate the patient anatomy shape variations. More specifically, in various embodiments, the RF coil array allows expansion in right/left directions as well as in AP direction, etc. Moreover, coupling the RF coil array to the preamplifier described herein provides sufficient isolations between the coil elements regardless of the coil elements relative spatial relationship. The expandable array is configured to operate in a plurality of operational modes, such as for example, primary mode and extended modes. In the primary mode, the coil elements are overlapped such that the RF coil array creates optimized SNR for an average anatomy coverage application. In extended modes, the relative distance between the coil elements is mechanically adjusted to extend the coverage or to cover different shapes of anatomies.

Figure 11:
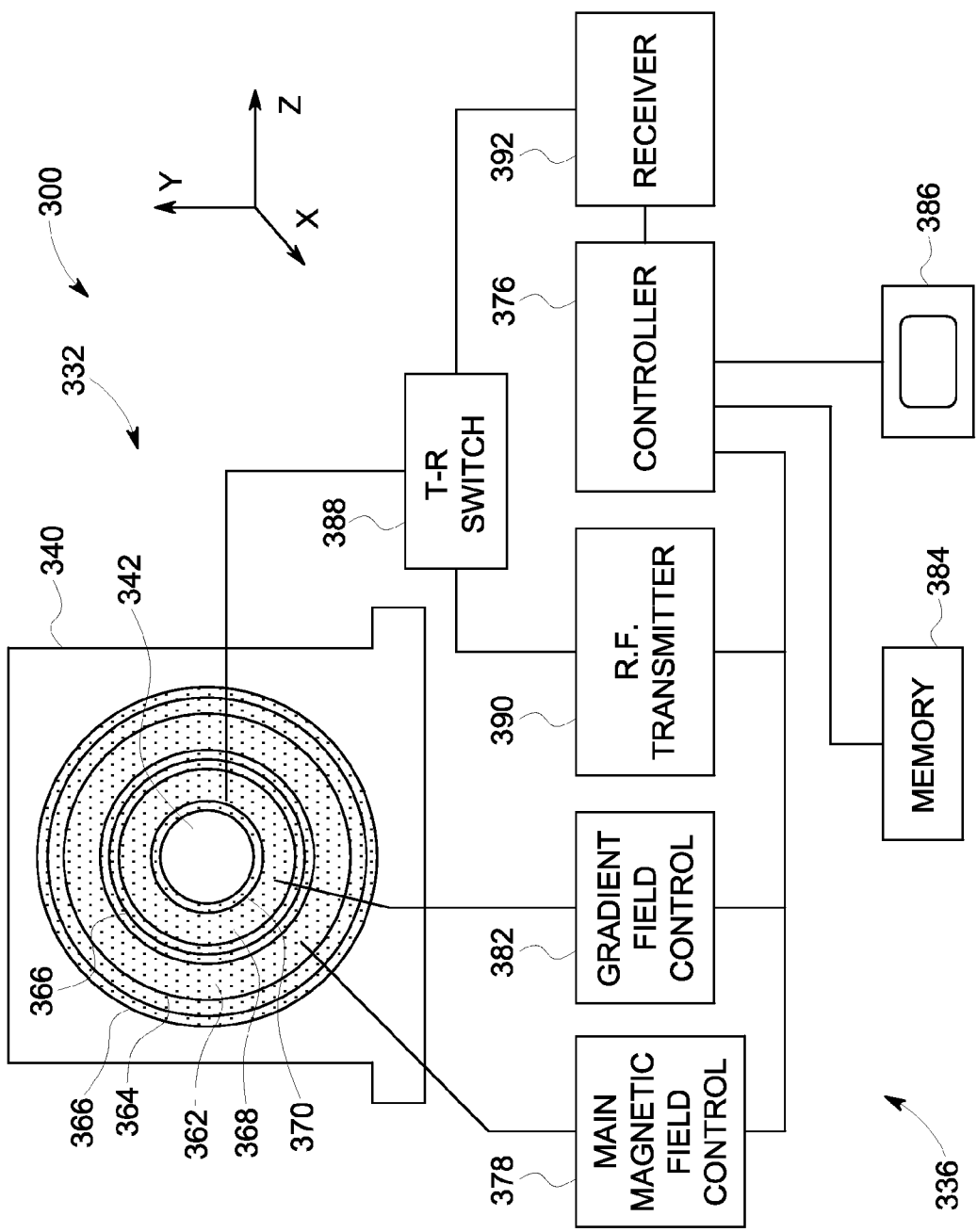
FIG. 11 is a block diagram of an MRI system in which a pre-amplifier formed in accordance with various embodiments may be implemented.

The various embodiments described and/or illustrated herein may be implemented, for example, with an MRI system 300 as shown in FIG. 11. It should be appreciated that although the imaging system 300 is illustrated as a single modality imaging system, the various embodiments may be implemented in or with multi-modality imaging systems. The imaging system 300 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 11, the MRI system 300 generally includes an imaging portion 332 and a processing portion 336 that may include a processor or other computing or controller device. The MRI system 300 includes within a gantry 340 a superconducting magnet 362 formed from magnetic coils supported on a magnet coil support structure. However, in other embodiments, different types of magnets may be used, such as permanent magnets or electromagnets. A vessel 364 (also referred to as a cryostat) surrounds the superconducting magnet 362 and is filled with liquid helium to cool the coils of the superconducting magnet 362. Thermal insulation 366 is provided surrounding the outer surface of the vessel 364 and the inner surface of the superconducting magnet 362. A plurality of magnetic gradient coils 368 are provided within the superconducting magnet 362 and an RF transmit coil 370 is provided within the plurality of magnetic gradient coils 368. In some embodiments the RF transmit coil 370 may be replaced with a transmit and receive coil as described in more detail herein. The components within the gantry 340 generally form the imaging portion 332. It should be noted that although the superconducting magnet 362 is a cylindrical shaped, other shapes of magnets can be used.

The processing portion 336 generally includes a controller 356, a main magnetic field control 378, a gradient field control 382, a memory 384, a display device 386, a transmit-receive (T-R) switch 388, an RF transmitter 390 and a receiver 392.

In operation, a body of an object, such as a patient or a phantom to be imaged, is placed in the bore 342 on a suitable support, for example, a patient table. The superconducting magnet 362 produces a uniform and static main magnetic field $B_o$ across the bore 342. The strength of the electromagnetic field in the bore 342 and correspondingly in the patient, is controlled by the controller 376 via the main magnetic field control 378, which also controls a supply of energizing current to the superconducting magnet 362.

The magnetic gradient coils 368, which include one or more gradient coil elements, are provided so that a magnetic gradient can be imposed on the magnetic field $B_o$ in the bore 342 within the superconducting magnet 362 in any one or more of three orthogonal directions x, y, and z. The magnetic gradient coils 368 are energized by the gradient field control 382 and are also controlled by the controller 376.

The RF transmit coil 370, which may include a plurality of coils, is arranged to transmit magnetic pulses and/or optionally simultaneously detect MR signals from the patient if receive coil elements are also provided, such as a surface coil configured as an RF receiver coil. The RF receiver coil (e.g., the RF receiver coil 12 shown in FIGS. 1-6, for example) may be of any type or configuration, for example, a separate receiver surface coil, and includes the impedance transformer 256 and preamplifiers 280 as described and illustrated in more detail herein. Moreover the system interface 220 (shown in FIG. 1) may form part of, for example, the controller 376, T-R switch 388 or receiver 392, which with the coil array may form the receive section 300.

The RF transmit coil 370 may be a body coil, such as a birdcage type coil. The receive surface coil 12 may be an array of RF coils provided within the RF transmit coil 370. The RF transmit coil 370 is detuned or decoupled from the receive surface coil(s) as described herein. Thus, the RF transmit coil 370 configured as a body part specific coil (e.g., torso coil), may be combined with the receive surface coil.

The RF transmit coil 370 and the receiver surface coil are selectably interconnected to one of the RF transmitter 390 or receiver 392, respectively, by the T-R switch 388. The RF transmitter 390 and T-R switch 388 are controlled by the controller 376 such that RF field pulses or signals are generated by the RF transmitter 390 and selectively applied to the patient for excitation of magnetic resonance in the patient. While the RF excitation pulses are being applied to the patient, the T-R switch 388 is also actuated to disconnect the receive surface coil from the receiver 392.

Following application of the RF pulses, the T-R switch 388 is again actuated to disconnect the RF transmit coil 370 from the RF transmitter 390 and to connect the receiver surface coil to the receiver 392. The receiver surface coil operates to detect or sense the MR signals resulting from the excited nuclei in the patient and communicates the MR signals to the receiver 392, which may be communicated to multiple channels as described in more detail herein. These detected MR signals are in turn communicated to the controller 376. The controller 376 includes a processor (e.g., image reconstruction processor), for example, that controls the processing of the MR signals to produce signals representative of an image of the patient.

The processed signals representative of the image are also transmitted to the display device 386 to provide a visual display of the image. Specifically, the MR signals fill or form a k-space that is Fourier transformed to obtain a viewable image. The processed signals representative of the image are then transmitted to the display device 386.

The various embodiments of the pre-amplifiers accommodate a relatively high source impedance while providing a relatively low input impedance. The various embodiments may provide higher blocking impedance than MRI systems that use a conventional source impedance of approximately 50 ohms. The various embodiments of the RF receiver coils may have a higher SNR. Because decoupling impedance can be directly translated to the reduction of induced RF current in a resonant loop, improvement of pre-amplifier decoupling efficiency may result in the reduction of RF cross-talk between RF receiver coils within an array. The reduction of the cross-talk between RF receiver coils may reduce the mutual interactions between the RF receiver coils, and may also lead to an effective way to further improve fundamental RF coil designs, including more condensed coil geometry, for more intrinsic SNR and/or improved parallel imaging performance in MRI. For example, it may not be necessary to follow the rule of 10% to 15%. The higher pre-amplifier blocking provided by the various embodiments may enable the simplification of RF receiver coil designs and/or may lead to the reduction or removal of isolation circuits between RF receiver coils without compromising performance of an RF receiver coil array, which may result in reductions or elimination of isolation adjustment during manufacturing. The various embodiments may reduce the cost of manufacturing RF receiver coils, preamplifiers, MRI receive sections, and/or MRI systems overall.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A radio frequency (RF) coil array comprising:
   an RF coil support structure; and
   a plurality of RF coils coupled to the RF coil support structure, the RF coil support structure configured to enable the plurality of RF coils to be positioned in an underlap configuration and repositioned to an overlap configuration; and
   a preamplifier coupled to the RF coils, the preamplifier comprising:
      an amplifier;
      an impedance transformer forming an impedance matching network between the RF coils to transform a coil impedance of the RF coils to a source impedance of at least approximately 100 ohms; and
      a field effect transistor (FET), the FET being electrically connected between the impedance transformer and the amplifier, the FET exhibiting a select noise circle for the source impedance.

2. The RF coil array of claim 1, wherein the RF coils are arranged in rows and columns on the RF coil support structure, the RF coil support structure configured to enable the columns of RF coils to be positioned in an underlap configuration and the rows of RF coils to be positioned in an overlap configuration.

3. The RF coil array of claim 1, wherein the RF coils are arranged in rows and columns on the RF coil support structure, the RF coil support structure configured to enable the columns of RF coils to be positioned in an overlap configuration and the rows of RF coils to be positioned in an underlap configuration.

4. The RF coil array of claim 1, wherein a portion of the RF coils are separated by a substantially equal distance in either the overlap or underlap configuration.

5. The RF coil array of claim 1, wherein the RF coil array is flexible.

6. The RF coil array of claim 1, wherein the RF coils are coupled to a flexible substrate.

7. The RF coil array of claim 1, further comprising a mechanical system, the RF coils being coupled to the mechanical system, the mechanical system configured to move the RF coils in an x-direction, a y-direction, and a z-direction.

8. The RF coil array of claim 1,
   wherein the amplifier is configured to receive at least one magnetic resonance (MR) signal from the RF coil and configured to generate an amplified MR signal, the array further comprising
   an input circuit electrically connected to the amplifier, the input circuit being configured to be electrically connected to an output of the RF coil for transmitting the at least one MR signal from the RF coil to the amplifier, the input circuit comprising the impedance transformer and the FET, the FET having an FET impedance, the impedance transformer being configured to transform the FET impedance into a preamplifier input impedance of less than approximately 5 ohms.

9. The RF coil array of claim 8, wherein the impedance transformer is configured to transform the source impedance into an impedance that is within a 0.3 dB noise circle of the FET.

10. A magnetic resonance imaging (MRI) system comprising:
    a gantry having a bore extending therethrough; and
    a radio frequency (RF) coil array configured to be inserted into the bore, the RF coil array comprising:
       an RF coil support structure; and
       a plurality of RF coils coupled to the RF coil support structure, the RF coil support structure configured to enable the plurality of RF coils to be positioned in an underlap configuration and repositioned to an overlap configuration; and
       a preamplifier coupled to the RF coils, the preamplifier comprising:
          an amplifier;
          an impedance transformer forming an impedance matching network between the RF coils to transform a coil impedance of the RF coils to a source impedance of at least approximately 100 ohms; and
          a field effect transistor (FET), the FET being electrically connected between the impedance transformer and the amplifier, the FET exhibiting a select noise circle for the source impedance.

11. The MRI system of claim 10, wherein the RF coils are arranged in rows and columns on the RF coil support structure, the RF coil support structure configured to enable the columns of RE coils to be positioned in an underlap configuration and the rows of RF coils to be positioned in an overlap configuration.

12. The MRI system of claim 10, wherein the RF coils are arranged in rows and columns on the RF coil support structure, the RF coil support structure configured to enable the columns of RF coils to be positioned in an overlap configuration and the rows of RF coils to be positioned in an underlap configuration.

13. The MRI system of claim 10, wherein a portion of the RF coils are separated by a substantially equal distance in either the overlap or underlap configuration.

14. The MRI system of claim 10, wherein the RF coil array is flexible.

15. The MRI system of claim 10, wherein the RF coils are coupled to a flexible substrate.

16. The MRI system of claim 10, wherein the RF coil array further comprises a mechanical system, the RF coils being coupled to the mechanical system, the mechanical system configured to move the RF coils in an x-direction, a y-direction, and a z-direction.

17. The MRI system of claim 10 wherein the amplifier is configured to receive at least one magnetic resonance (MR) signal from the RF coil and configured to generate an amplified MR signal, the array further comprising an input circuit electrically connected to the amplifier, the input circuit being configured to be electrically connected to an output of the RF coil for transmitting the at least one MR signal from the RF coil to the amplifier, the input circuit comprising the impedance transformer and the FET, the FET having an FET impedance, the impedance transformer being configured to transform the FET impedance into a preamplifier input impedance of less than approximately 5 ohms.

18. The MRI system of claim 17, wherein the impedance transformer is configured to transform the source impedance into an impedance that is within a noise circle of the FET.

19. The RF coil array of claim 1, wherein the preamplifier amplifies received MR signals from the RF coils and isolates the RF coils from each other.

20. The RF coil array of claim 1, wherein the impedance transformer is configured to transform a FET impedance of the FET into a preamplifier input impedance of less than approximately 5 ohms.

* * * * *